United States Patent
Mizuno et al.

(10) Patent No.: US 8,580,403 B2
(45) Date of Patent: Nov. 12, 2013

(54) ORGANIC LIGHT-EMITTING DIODE, DISPLAY AND ILLUMINATING DEVICE

(75) Inventors: Yukitami Mizuno, Tokyo (JP); Isao Amemiya, Machida (JP); Akiko Hirao, Kawasaki (JP); Isao Takasu, Tokyo (JP); Tomoko Sugizaki, Kawasaki (JP); Akio Amano, Machida (JP); Yasushi Shinjo, Kawasaki (JP); Tomoaki Sawabe, Tokyo (JP); Shintaro Enomoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 13/224,906

(22) Filed: Sep. 2, 2011

(65) Prior Publication Data
US 2012/0228585 A1   Sep. 13, 2012

(30) Foreign Application Priority Data
Mar. 8, 2011 (JP) .................. 2011-050622

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 546/79; 546/81; 548/440

(58) Field of Classification Search
USPC .................. 428/690, 917; 313/504, 505, 506; 548/440; 546/79, 81; 257/40, E51.05, 257/E51.026, E51.032
See application file for complete search history.

(56) References Cited

U.S. PATENT DOCUMENTS

| | | | |
|---|---|---|---|
| 2,499,187 A | 2/1950 | Flowers et al. | |
| 2009/0017331 A1 * | 1/2009 | Iwakuma et al. | 428/690 |

FOREIGN PATENT DOCUMENTS

| | | |
|---|---|---|
| JP | 2001-160490 | 6/2001 |
| JP | 2002-299059 | 10/2002 |
| JP | 2008-074939 | 4/2008 |
| WO | 2008/029729 A1 | 3/2008 |
| WO | WO 2009/147011 | * 10/2009 |
| WO | 2009/147011 A1 | 12/2009 |
| WO | 2010/079051 A1 | 7/2010 |
| WO | 2010/122810 A1 | 10/2010 |

OTHER PUBLICATIONS

Shimomura, Osamu, et al., "Synthesis and Radical Polymerization of 2-Vinyldibenzothiophene", Journal of Polymer Science: Part A: Polymer Chemistry, 1997, vol. 35, 281-2819.
M.-J. Yang, et al., "Use of Poly (9-vinylcarbazole) as Host Material for Iridium Complexes in High-Efficiency Organic Light-Emitting Devices", Jpn. J. Appl Phys., vol. 39, 2000, pp. L828-L829.
Shimomura, Osamu, et al., "Synthesis and Radical Polymerization of 2-Vinyldibenzothiophene", Journal of Polymer Science: Part A: Polymer Chemistry, 1997, vol. 35, 2813-2819.
Extended European Search Report for European Application No. 11180008.2 dated Jun. 14, 2012.
Japanese First Office Action for Application No. 2011-050622 Dated Jan. 8, 2013, 5 pages.

* cited by examiner

*Primary Examiner* — Gregory Clark
(74) *Attorney, Agent, or Firm* — Turocy & Watson, LLP

(57) ABSTRACT

According to one embodiment, there is provided an organic light-emitting diode including an anode and a cathode which are arranged apart from each other, and an emissive layer interposed between the anode and the cathode and including a host material and an emitting dopant. The host material includes a polymer containing dibenzothiophene backbones represented by the following formula (1) as repeating units:

Chem 1

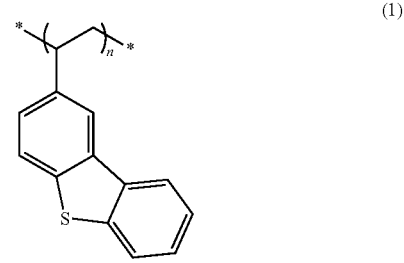

(1)

wherein n is an integer of from 20 to 10,000.

6 Claims, 3 Drawing Sheets

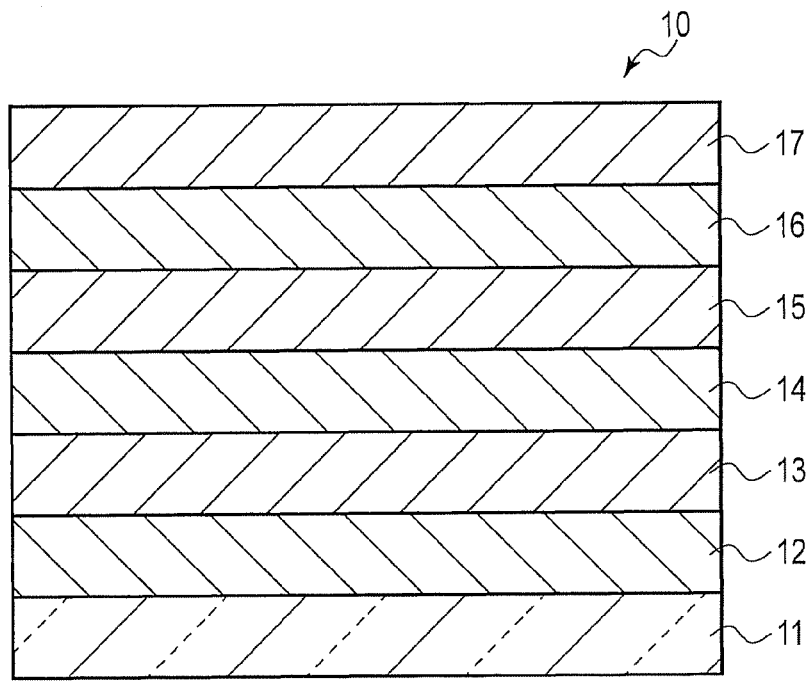
F I G. 1
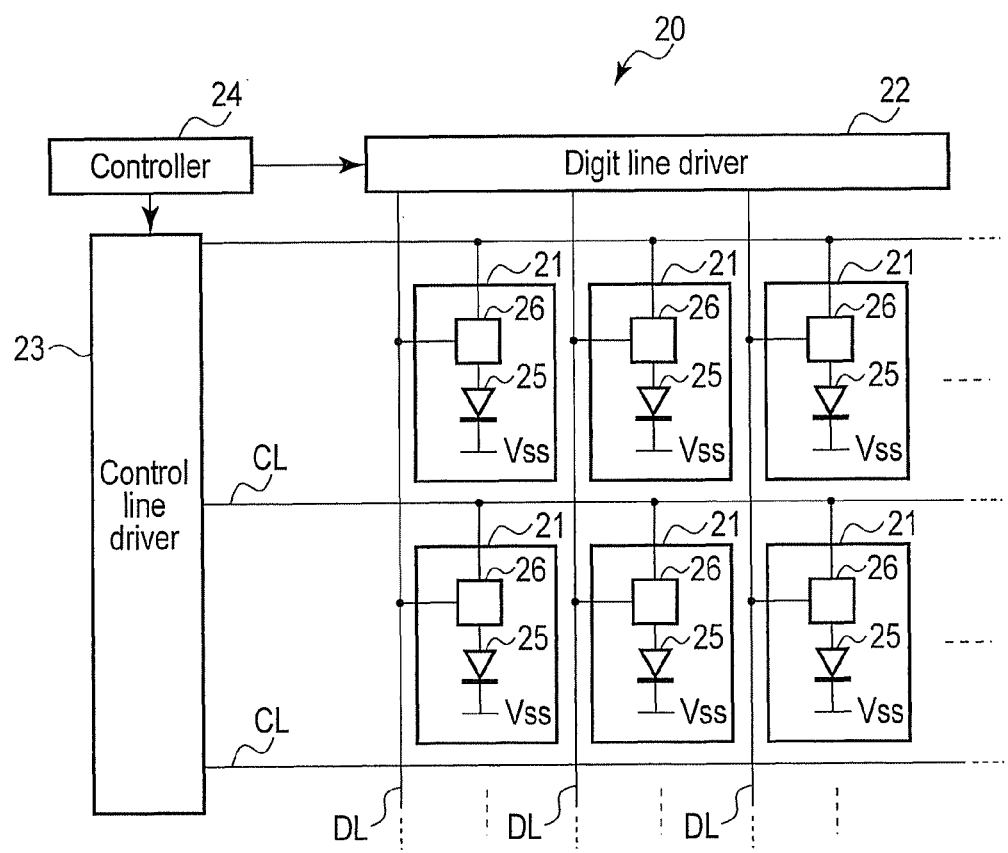
F I G. 2

ORGANIC LIGHT-EMITTING DIODE, DISPLAY AND ILLUMINATING DEVICE

CROSS-REFERENCE TO RELATED APPLICATIONS

This application is based upon and claims the benefit of priority from prior Japanese Patent Application No. 2011-050622, filed Mar. 8, 2011, the entire contents of which are incorporated herein by reference.

FIELD

Embodiments described herein relate generally to an organic light-emitting diode, and a display and an illuminating device using the same.

BACKGROUND

In recent years, organic light-emitting diodes have been attracting attention as a technology for next-generation displays and lightings. In the early study of organic light-emitting diodes, fluorescence has been mainly used. However, in recent years, an organic light-emitting diode utilizing phosphorescence which exhibits higher internal quantum efficiency has been attracting attention.

Mainstream of emissive layers in recent years are those in which a host material comprising an organic material is doped with an emissive metal complex including iridium or platinum as a central metal. The host materials in the emissive layer are classified roughly into small-molecular host materials and polymer host materials. An emissive layer containing a small-molecular host material is mainly formed by vacuum co-evaporation of a small-molecular host material and an emitting dopant. An emissive layer containing a polymer host material is mainly formed by applying a solution obtained by blending the polymer host material with the emitting dopant as essential components. Typical examples of the polymer host material include polyvinylcarbazole (PVK).

When a polymer material is used as a host material, problems that the polymer material itself is deteriorated by various mechanisms, e.g., when an electrical charge is passed through the polymer material, the material itself degrades or causes a side reaction and converts to other substance, and the like are caused. Specifically, it is already known that polyvinylcarbazole is a material through which an electrical charge is hard to be passed, and it is necessary to apply a high voltage so as to pass an electrical charge. Therefore, a superfluous load is applied to the material, whereby the material is easily deteriorated. For the above reasons, there is a demand for a host material that is hard to be deteriorated even an electrical charge is passed therethrough. Furthermore, use of such material leads to extension of the lifetimes of organic light-emitting diodes.

BRIEF DESCRIPTION OF THE DRAWINGS

FIG. 1 is a cross-sectional view of an organic light-emitting diode of an embodiment;
FIG. 2 is a circuit diagram showing a display of an embodiment.

DETAILED DESCRIPTION

Figure 3:
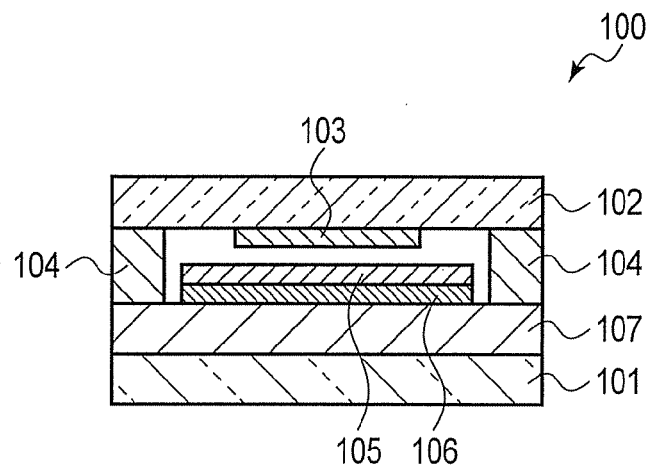
FIG. 3 is a cross-sectional view showing a lighting device of an embodiment.

In general, according to one embodiment, there is provided an organic light-emitting diode including an anode and a cathode which are arranged apart from each other; and an emissive layer interposed between the anode and the cathode and including a host material and an emitting dopant. The host material includes a polymer containing dibenzothiophene backbones represented by the following formula (1) as repeating units:

Chem 1

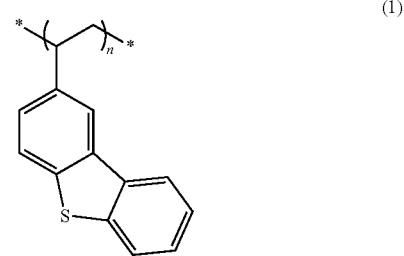

(1)

wherein n is an integer of from 20 to 10,000.

Embodiments of the present invention are explained below in reference to the drawings.

FIG. 1 is a cross-sectional view of the organic light-emitting diode of an embodiment of the present invention.

In the organic light-emitting diode 10, an anode 12, hole transport layer 13, emissive layer 14, electron transport layer 15, electron injection layer 16 and cathode 17 are formed in sequence on a substrate 11. The hole transport layer 13, electron transport layer 15 and electron injection layer 16 are formed if necessary.

Each member of the organic light-emitting diode of the embodiment of the present invention is explained below in detail.

The emissive layer 14 receives holes and electrons from the anode and the cathodes, respectively, followed by recombination of holes and electrons which results in the light emission. The energy generated by the recombination excites the host material in the emissive layer. An emitting dopant is excited by energy transfer from the excited host material to the emitting dopant, and the emitting dopant emits light when it returns to the ground state.

The emissive layer 14 contains a luminescent metal complex (hereinafter, referred to as an emitting dopant), which is doped into the host material of an organic material. In this embodiment, the host material includes a polymer containing dibenzothiophene backbones represented by the following formula (1) as repeating units. Hereinafter, the polymer represented by the following formula (1) is also referred to as polyvinyldibenzothiophene (PVDBT).

Chem 2

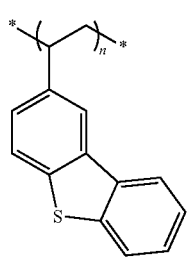

(1)

In the above formula (1), n is an integer of from 20 to 10,000. When n is less than 20, the polymer is generally difficult to be defined as a polymer, and the coating and film forming properties when it is used as a host material are also not fine. On the other hand, when n is more than 10,000, the polymer becomes difficult to be dissolved in a solvent, and thus lacks adequacy as a host material. As the polymer represented by the above formula (1), it is specifically preferable to use a polymer having a number average molecular weight of from 400 to 2,000,000.

The polymer represented by the above formula (1) is hard to be deteriorated when an electrical charge is passed therethrough. Therefore, by using the compound represented by the above formula (1) as a host material, an organic light-emitting diode having a longer lifetime than even before can be obtained.

Further, the organic light-emitting diode prepared by using the polymer represented by the above formula (1) as a host material can obtain a higher luminous efficiency and a higher luminance than those of conventional diodes when a current of a same amount is passed therethrough.

The polymer represented by the above formula (1) is a known compound (see for example, J. Polym. Sci. part A: Polym Chem. 35, 2813 (1997)). However, there is no example using this as a host material for an organic light-emitting diode.

As the emitting dopant, any of phosphorescent dopants and fluorescent dopants can be used, and the emitting dopant can be selected from various emitting dopants that are known in the art. For example, the following materials can be used, but the emitting dopant is not limited to these materials.

Chem 3-1

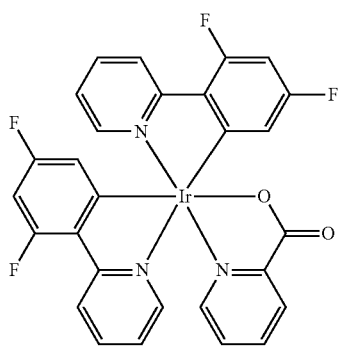

FIrpic

Bis(3,5-difluoro-2-(2-pyridyl)phenyl)-(2-carboxypyridyl)iridium(III)

Chem 3-2

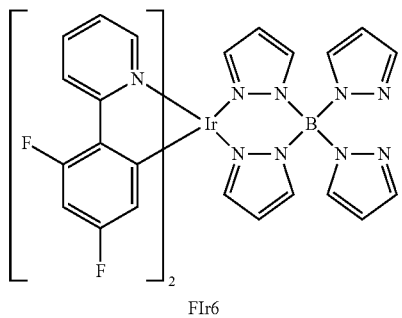

FIr6

Bis(2,4-difluorophenylpyridinato)tetrakis(1-pyrazolyl)Borate iridium(III)

Chem 3-3

Facial-iridium(III)tris(1-phenyl-3-methylmendiimidazolin-2-ylidene-C,C2')

Chem 3-4

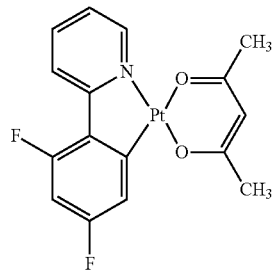

Platinum(III) [2(4,6-difluorophenyl)pyridinato-N, C²]-(acetylacetonate)

Chem 3-5

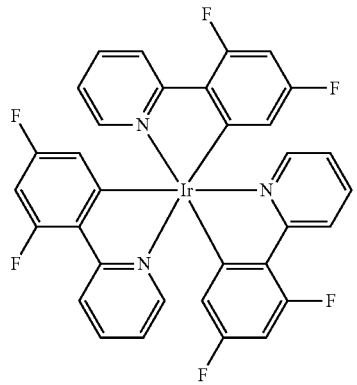

Tris(2-(2,4-difluorophenyl)pyridine)iridium(III)

The emissive layer 14 may include two or more emitting dopants together. Also, the emissive layer 14 may be configured by multiple layers each includes one or more emitting dopant(s).

In order to the carrier balance between holes and electrons in the emissive layer so that the luminous efficiency is improved, the emissive layer may further comprise an electron-transport material or a hole-transport material.

A method for forming the emissive layer 14 includes, for example, spin coating, but is not particularly limited thereto as long as it is a method which can form a thin film. A solution containing an emitting dopant and host material is applied in a desired thickness, followed by heating and drying with a hot plate and the like. The solution to be applied may be filtrated with a filter in advance.

The thickness of the emissive layer 14 is preferably 10-100 nm. The ratio of the host material and emitting dopant in the emissive layer 14 is arbitrary as long as the effect of the present invention is not impaired.

The substrate 11 is a member for supporting other members. The substrate 11 is preferably one which is not distorted by heat or organic solvents. A material of the substrate 11 includes, for example, an inorganic material such as alkali-free glass and quartz glass; plastic such as polyethylene, polyethylene terephthalate (PET), polyethylene naphthalate (PEN), polyimide, polyamide, polyamide-imide, liquid crystal polymer, and cycloolefin polymer; polymer film; and metal substrate such as stainless steel (SUS) and silicon. In order to obtain light emission, a transparent substrate consisting of glass, synthesized resin, and the like is preferably used. Shape, structure, size, and the like of the substrate 11 are not particularly limited, and can be appropriately selected in accordance with application, purpose, and the like. The thickness of the substrate 11 is not particularly limited as long as it has sufficient strength for supporting other members.

The anode 12 is formed on the substrate 11. The anode 12 injects holes into the hole transport layer 13 or the emissive layer 14. A material of the anode 12 is not particularly limited as long as it exhibits conductivity. Generally, a transparent or semitransparent material having conductivity is deposited by vacuum evaporation, sputtering, ion plating, plating, and coating methods, and the like. For example, a metal oxide film and semitransparent metallic thin film exhibiting conductivity may be used as the anode 12. Specifically, a film prepared by using conductive glass consisting of indium oxide (NESA etc.), tin oxide, indium tin oxide (ITO) which is a complex thereof, zinc oxide, fluorine doped tin oxide (FTO), indium zinc oxide; gold; platinum; silver; copper; and the like are used. In particular, it is preferably a transparent electrode consisting of ITO. As an electrode material, organic conductive polymer such as polyaniline, the derivatives thereof, polythiophene, the derivatives thereof, and the like may be used. When ITO is used as the anode 12, the thickness thereof is preferably 30-300 nm. If the thickness is thinner than 30 nm, the conductivity is decreased and the resistance is increased, resulting in reducing the luminous efficiency. If it is thicker than 300 nm, ITO loses flexibility and is cracked when it is under stress. The anode 12 may be a single layer or stacked layers each composed of materials having various work functions.

The hole transport layer 13 is optionally arranged between the anode 12 and emissive layer 14. The hole transport layer 13 receives holes from the anode 12 and transports them to the emissive layer side. As a material of the hole transport layer 13, for example, polythiophene type polymer such as a conductive ink, poly(ethylenedioxythiophene):polystyrene sulfonate [hereinafter, referred to as PEDOT:PSS] can be used, but is not limited thereto. A method for forming the hole transport layer 13 is not particularly limited as long as it is a method which can form a thin film, and may be, for example, a spin coating method. After applying a solution of hole transport layer 13 in a desired film thickness, it is heated and dried with a hotplate and the like. The solution to be applied may be filtrated with a filter in advance.

The electron transport layer 15 is optionally formed on the emissive layer 14. The electron transport layer 15 receives electrons from the electron injection layer 16 and transports them to the emissive layer side. As a material of the electron transport layer 15 is, for example, tris[3-(3-pyridyl)-mesityl]borane [hereinafter, referred to as 3TPYMB], tris(8-hydroxyquinolinato)aluminum [hereinafter, referred to as Alq3], and basophenanthroline (BPhen), but is not limited thereto. The electron transport layer 15 is formed by vacuum evaporation method, a coating method or the like.

The electron injection layer 16 is optionally formed on the electron transport layer 15. The electron injection layer 16 receives electrons from the cathode 17 and transports them to the electron transport layer 15 or emissive layer 14. A material of the electron injection layer 16 is, for example, CsF, LiF, and the like, but is not limited thereto. The electron injection layer 16 is formed by vacuum evaporation method, a coating method or the like.

The cathode 17 is formed on the emissive layer 14 (or the electron transport layer 15 or the electron injection layer 16). The cathode 17 injects electrons into the emissive layer 14 (or the electron transport layer 15 or the electron injection layer 16). Generally, a transparent or semitransparent material having conductivity is deposited by vacuum evaporation, sputtering, ion plating, plating, coating methods, and the like. Materials for the cathode include a metal oxide film and semitransparent metallic thin film exhibiting conductivity. When the anode 12 is formed with use of a material having high work function, a material having low work function is preferably used as the cathode 17. A material having low work function includes, for example, alkali metal and alkali earth metal. Specifically, it is Li, In, Al, Ca, Mg, Na, K, Yb, Cs, and the like.

The cathode 17 may be a single layer or stacked layers each composed of materials having various work functions. Further, it may be an alloy of two or more metals. Examples of the alloy include a lithium-aluminum alloy, lithium-magnesium alloy, lithium-indium alloy, magnesium-silver alloy, magnesium-indium alloy, magnesium-aluminum alloy, indium-silver alloy, and calcium-aluminum alloy.

The thickness of the cathode 17 is preferably 10-150 nm. When the thickness is thinner than the aforementioned range, the resistance is excessively high. When the film thickness is thicker, long period of time is required for deposition of the cathode 17, resulting in deterioration of the performance due to damage to the adjacent layers.

Explained above is an organic light-emitting diode in which an anode is formed on a substrate and a cathode is arranged on the opposite side to the substrate, but the substrate may be arranged on the cathode side.

FIG. 2 is a circuit diagram showing a display according to an embodiment.

A display 20 shown in FIG. 2 has a structure in which pixels 21 are arranged in circuits each provided with a lateral control line (CL) and vertical digit line (DL) which are arranged matrix-wise. The pixel 21 includes a light-emitting diode 25 and a thin-film transistor (TFT) 26 connected to the light-emitting diode 25. One terminal of the TFT 26 is connected to the control line and the other is connected to the digit line. The digit line is connected to a digit line driver 22. Further, the control line is connected to the control line driver 23. The digit line driver 22 and the control line driver 23 are controlled by a controller 24.

FIG. 3 is a cross-sectional view showing a lighting device according to an embodiment.

A lighting device 100 has a structure in which an anode 107, an organic light-emitting diode layer 106 and a cathode 105 are formed in this order on a glass substrate 101. A seal glass 102 is disposed so as to cover the cathode 105 and adhered using a UV adhesive 104. A drying agent 103 is disposed on the cathode 105 side of the seal glass 102.

EXAMPLES

Example

PVDBT was used as a host material of an emitting layer to fabricate an organic light-emitting diode. The layer structure of this diode is as follows: ITO 100 nm/PEDOT:PSS 50 nm/PVDBT:FIrpic 70 nm/3TPYMB 10 nm/CsF 0.5 nm/Al 150 nm.

The anode was a transparent electrode made of ITO (indium-tin oxide) 100 nm in thickness.

As the material of the hole-transport layer, an aqueous poly(ethylenedioxythiophene):poly(styrene.sulfonic acid) [PEDOT:PSS] solution which is conductive ink was used. An aqueous PEDOT:PSS solution was applied by spin coating, and dried under heating to form a hole-transport layer 50 nm in thickness.

As the materials for the emissive layer, bis(3,5-difluoro-2-(2-pyridyl)phenyl-(2-carboxypyridyl)iridium(III) (hereinafter referred to as FIrpic) was used as the emitting dopant, and polyvinyldibenzothiophene (number average molecular weight: 50,000, molecular weight distribution: 3.2) was used as the host material. These compounds were weighed such that the ratio by weight of these compounds is as follows: PVDBT:FIrpic=95:5, and dissolved in chlorobenzene to obtain a solution, which was applied by spin coating, followed by drying under heating to form an emissive layer 70 nm in thickness.

The electron-transport layer was formed in a thickness of 10 nm by vapor evaporation of tris[3-(3-pyridyl)-mesityl]borane [3TPYMB]. The electron injection layer was formed of CsF 0.5 nm in thickness and the cathode was formed of Al 150 nm in thickness.

Comparative Example

An organic light-emitting diode was prepared in a manner similar to Example 1, except that PVK was used as a host material for comparison. Here, Poly(9-vinylcarbazole) (trade name, manufactured by Aldrich, Catalog No. 368350, molecular weight distribution (polymerization degree): 2, number average molecular weight: 25,000 to 50,000) was used as PVK.

Test Example 1

Measurement of EL Spectrum

Figure 4:
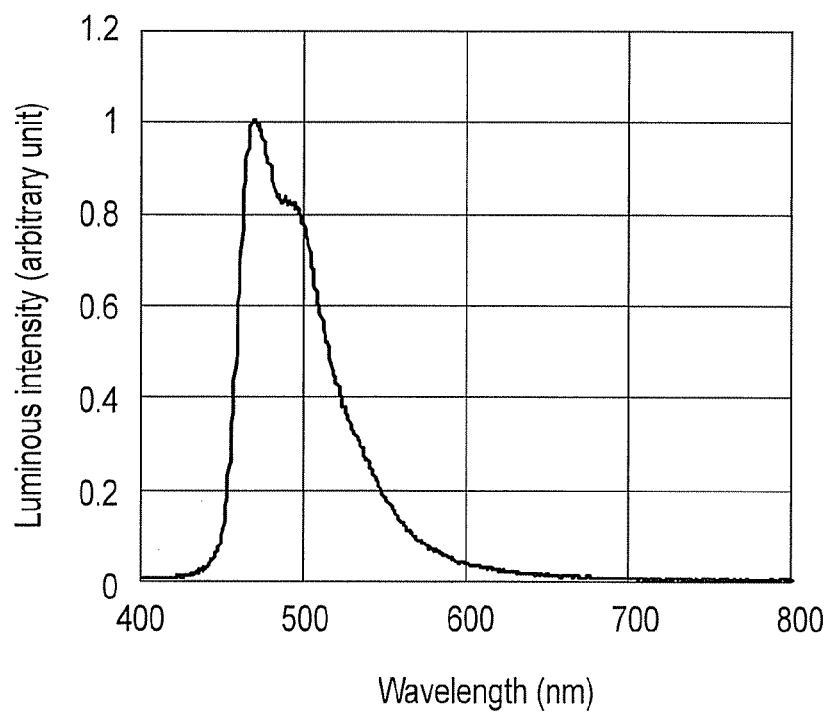
FIG. 4 is a view showing the electroluminescence spectrum of an organic light-emitting diode according to Example and Comparative example.

The electroluminescence (EL) spectra at voltage application of the organic light-emitting diodes according to Example and Comparative Example were measured. The measurement was conducted by using a high sensitivity multi-channel spectroscope C10027-01 manufactured by Hamamatsu Photonics K.K. The results are shown in FIG. 4. The spectra of Example and Comparative Example were completely overlapped, and thus it could be confirmed that the emitting dopant emitted blue light in both of the organic light-emitting diodes. It was found from this result that PVDBT used in Example is useful as a host material for organic light-emitting diodes.

Test Example 2

Comparison of Luminous Characteristics

For the organic light-emitting diodes according to Example and Comparative Example, the relationship between the current density and luminous efficiency was investigated. The luminous efficiency was obtained by measuring a luminance and measuring a current and a voltage at the same time. The luminance was measured using a Si Photodiode S7610 (trade name, manufactured by Hamamatsu Photonics K.K.) with a visibility filter. Further, the current and the voltage were measured using a Semiconductor Parameter Analyzer 4156b (trade name, manufactured by Hewlett Packard). The results are shown in FIG. 5.

Figure 5:
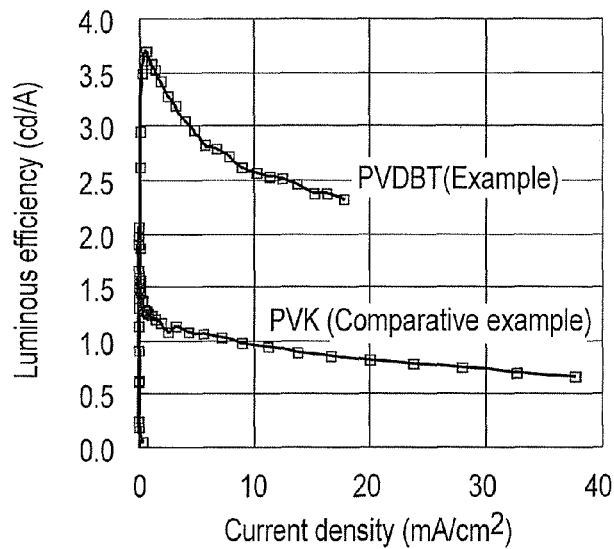
FIG. 5 is a view showing the relationship between the current density and luminous efficiency of the diode according to Example and Comparative example.

It is understood from FIG. 5 that a higher luminous efficiency than that of Comparative Example can be obtained in Example when compared under a same current density. That the luminous efficiency compared under the same current density is high means that the luminance compared under the same current density is also high.

Test Example 3

Comparison of Lifetimes of Diodes

For the organic light-emitting diodes according to Example and Comparative Example, the lifetimes of the diodes were compared. The lifetime of the diode was evaluated by measuring the luminance over time. The luminance was measured using a Si Photodiode S7610 (trade name, manufactured by Hamamatsu Photonics K.K.) with a visibility filter.

Figure 6:
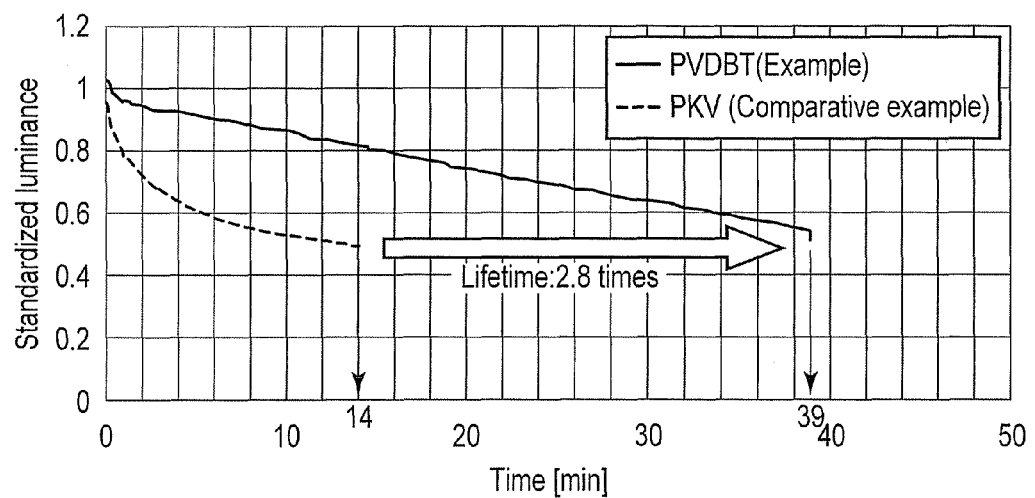
FIG. 6 is a drawing showing the comparison of the lifetimes of the organic light-emitting diodes according to Example and Comparative Example.

The results are shown in FIG. 6. The standardized luminance on the vertical axis means, when the luminance at time 0 is defined as 1, a luminance at each time thereafter that is represented by a ratio with respect to the luminance at time 0. Namely, the standardized luminance can be represented by the formula: the actually measured luminance at each time/ the luminance at time 0. It is found from FIG. 6 that the lifetime of the organic light-emitting diode of Example is about 2.8 times of that of the organic light-emitting diode of Comparative Example. From this result, it can be considered that PVDBT is hardly deteriorated by passage of an electrical charge, and a diode having a long lifetime can be obtained by using it as a host material for an organic light-emitting diode.

According to the above embodiments or the examples, by using a host material that is hard to be deteriorated by passage of an electrical charge, an organic light-emitting diode having improved lifetime and luminance, and a display and a lighting device using the diode can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic light-emitting diode comprising:
an anode and a cathode which are arranged apart from each other; and
an emissive layer interposed between the anode and the cathode and comprising a host material and an emitting dopant, wherein the host material comprises a polymer containing dibenzothiophene backbones represented by the following formula (1) as repeating units:

Chem 1

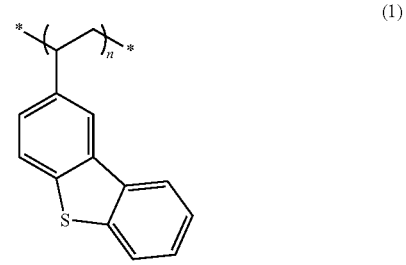

(1)

wherein n is an integer of from 20 to 10,000.

2. The organic light-emitting diode according to claim 1, wherein the polymer represented by the formula (1) has a number average molecular weight of from 400 to 2,000,000.

3. The organic light-emitting diode according to claim 1, wherein the emitting dopant is a phosphorescent material.

4. The organic light-emitting diode according to claim 3, wherein the color of emitting light of the phosphorescent material is blue.

5. A display comprising the organic light-emitting diode according to claim 1.

6. A lighting device comprising the organic light-emitting diode according to claim 1.

* * * * *